United States Patent [19]

Nakama et al.

[11] Patent Number: 4,584,701

[45] Date of Patent: Apr. 22, 1986

[54] REVERBERATOR HAVING TAPPED AND RECIRCULATING DELAY LINES

[75] Inventors: Yasutoshi Nakama; Koji Watanabe, both of Osaka, Japan

[73] Assignee: Matsushita Electric Industrial Co., Ltd., Osaka, Japan

[21] Appl. No.: 565,555

[22] Filed: Dec. 27, 1983

[30] Foreign Application Priority Data

Dec. 27, 1982 [JP] Japan .............................. 57-231550

[51] Int. Cl.$^4$ .............................................. H03G 3/00

[52] U.S. Cl. .............................. 381/63; 84/DIG. 26; 84/DIG. 4

[58] Field of Search .............................. 381/62, 63, 61; 84/DIG. 26, 1.24

[56] References Cited

U.S. PATENT DOCUMENTS

| | | | |
|---|---|---|---|
| 3,806,806 | 4/1974 | Brolin | 325/38 B |
| 3,878,465 | 4/1975 | Stephenne et al. | 325/38 B |
| 4,184,047 | 1/1980 | Langford | 381/63 |
| 4,215,242 | 7/1980 | Gross | 381/63 |
| 4,472,993 | 9/1984 | Futamase et al. | 381/62 |

OTHER PUBLICATIONS

Electrical Design News, vol. 22, No. 1, Jan. 1977, pp. 55–61, Denver, US; R. R. Buss: "CCD's Improve Audio System Performance and Generate Effects", p. 59, left-hand column, line 5–right-hand column, line 57; FIG. 6.

*Primary Examiner*—Forester W. Isen

*Attorney, Agent, or Firm*—Pollock, VandeSande & Priddy

[57] ABSTRACT

A reverberator comprises a tapped delay line (2, 3, 4, 5, 10) connected to an analog audio signal source (1) for deriving therefrom at least one pair of output signals which are respectively delayed by first and second different values with respect to the source signal, the ratio of the first to second values being an irrational number. A recirculating delay line (6, 7, 11, 12) is connected to the output of the tapped delay line having a delay element (63, 73, 113, 123) for introducing an additional delay to the output signals of the tapped delay line and a resistive recirculating path (65, 75, 115, 125) for recirculating the additionally delayed signals through the delay element. The output of the recirculating delay line is combined with the source signal to derive a reverberating audio signal.

13 Claims, 5 Drawing Figures

REVERBERATOR HAVING TAPPED AND RECIRCULATING DELAY LINES

BACKGROUND OF THE INVENTION

The present invention relates to reverberators, and particularly to an electronic reverberator which synthesizes realistic reverberations.

It is known in the art that to electronically synthesize a realistic reverberation effect the following conditions must be satisfied: (1) an extremely long reverberation time should not exist at particular frequencies in the audio frequency spectrum, (2) reverberation should decay substantially following a logarithmic curve as a function of time, and (3) reverberating sound components should be spaced apart such that their spacings increase as a function of the square of the amount of time elapsed from the time of occurrence of the direct, or original sound. Difficulties have hitherto been encountered to electronically synthesize the reverberation pattern as required by the above-noted condition (3) due in part to the limitations on the freedom of choice in circuit components and due in part to the occurrence of peaks and dips in the frequency response.

SUMMARY OF THE INVENTION

The present invention overcomes the above noted disadvantages by introducing different amounts of delay to a source signal so that the ratio of delay times is an irrational number, further introducing an additional delay to a signal which combines the differently delayed signals and recirculating it through a resistive path. The delayed signals occur at random spacings which enable the reverberating components to occur at close intervals while eliminating the undesirable peaks and dips in the audio spectrum.

A reverberator constructed according to the present invention comprises a tapped delay line connected to an analog audio signal source for deriving therefrom at least one pair of output signals which are respectively delayed by first and second different values with respect to the source signal, the ratio of the first to second values being an irrational number. A recirculating delay line is connected to the output of the tapped delay line having a delay element for introducing an additional delay to the output signals of the tapped delay line and a resistive recirculating path for recirculating the additionally delayed signals through the delay element. The output of the recirculating delay line is combined with the source signal to derive a reverberating audio signal.

Preferably, each of the tapped delay line and the recirculating delay line includes an analog to digital converter and a digital memory for introducing the required amounts of delay and a digital to analog converter for converting the output of the memory to a corresponding analog signal. A delta modulator, preferably of an adaptive type, serves this purpose well.

BRIEF DESCRIPTION OF THE DRAWINGS

The present invention will be described in further detail with reference to the accompanying drawings, in which.

DETAILED DESCRIPTION

Figure 1:
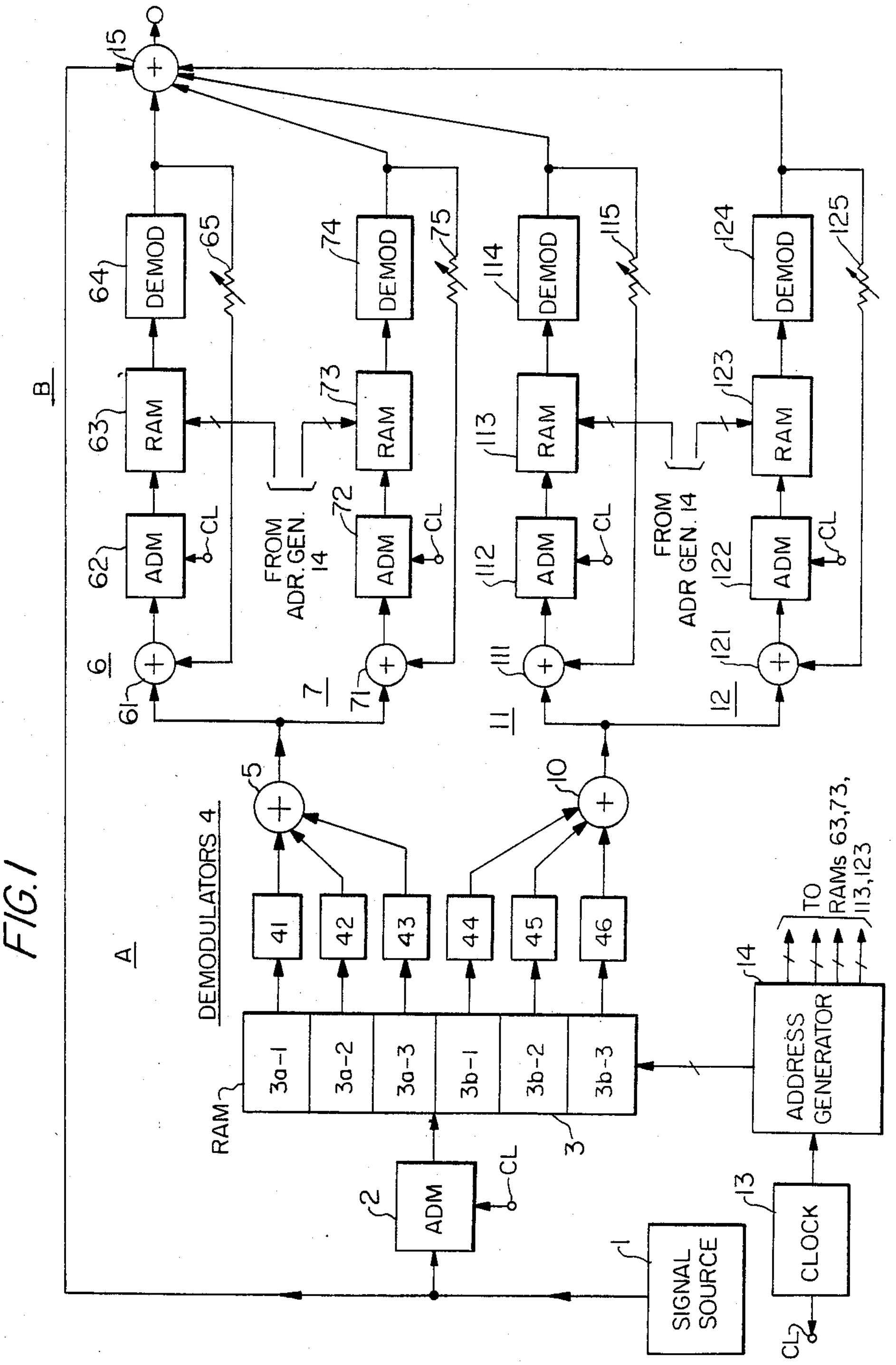
FIG. 1 is a block diagram of a preferred embodiment of the present invention.

Referring now to FIG. 1, there is shown a preferred embodiment of the reverberator of the present invention. The reverberator generally comprises first, tapped delay line section A and a second, recirculating delay line section B. The first section A comprises an adaptive delta modulator 2 which receives an analog input signal from an audio signal source 1, a tapped delay line which comprises essentially a random access memory 3, a plurality of demodulators 4, and adders 5, 6. The memory 3 comprises a plurality of sets of six memory cells **3*a*-1, 3*a*-2, 3*a*-3, 3*b*-1, 3*b*-2 and 3*b*-3. For the sake of simplicity, only one set of such memory cells is shown. The memory cells 3*a*-1 to 3*a*-3 form a first memory group 3*a* and memory cells 3*b*-1 to 3*b*-3 form a second memory group 3*b***.

As will be described later, the adaptive delta modulator 2 segments the analog audio signal into incremental values of a variable step size and converts them into a one-bit digital signal in response to a clock pulse. This clock pulse is typically generated at a repetition rate of 125 kHz by a time base clock source 13, so that the output of the modulator 2 is a series of binary 1's and 0's at intervals of 8 microseconds. The one-bit digital signal is presented for storage to the random access memory 3. For example, a binary "1" from the modulator 2, causes a logical "1" to be written into all the memory cells of a given set and a subsequent binary "0" of the modulator output causes a logical "0" to be written into all the memory cells of the next set. To achieve write and readout operations, an address generator 14 is provided. This address generator sequentially generates an address code for storing a binary 1 or 0 into the cells **3*a*-1, 3*a*-2, 3*a*-3, 3*b*-1, 3*b*-2 and 3*b*-3 of a given set and then generates readout address codes at different delay times so that the memory cells 3*a*-1, 3*a*-2, 3*a*-3, 3*b*-1, 3*b*-2 and 3*b*-3** are read out at times which are delayed by different amounts $t_{11}$, $t_{22}$, $t_{33}$, $t_{44}$, $t_{55}$ and $t_{66}$, respectively. These delay times are selected so that the delay time ratios $t_{22}/t_{11}$, $t_{33}/t_{22}$, $t_{55}/t_{44}$, $t_{66}/t_{55}$ give fractional number which may be either rational or irrational. Typical values of the delay times are $t_{11}=83.2$ ms, $t_{22}=42.8$ ms, $t_{33}=18.4$ ms, $t_{44}=70.1$ ms, $t_{55}=29.8$ ms and $t_{66}=9.9$ ms.

The binary 1's and 0's read out of memory cells **3*a*-1 to 3*a*-3 are applied to demodulators 41 to 43 respectively and summed in the adder 5, and those read out of memory cells 3*b*-1 to 3*b*-3 are applied to demodulators 44 to 46 respectively and summed in the adder 10**.

Figure 2:
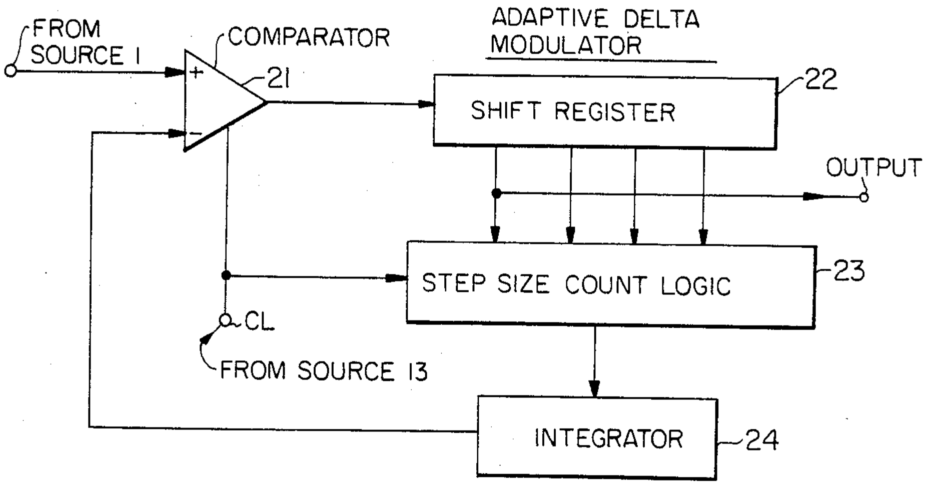
FIG. 2 is a block diagram of an adaptive delta modulator employed in the present invention.

A preferred embodiment of the adaptive delta modulator 2 is illustrated in FIG. 2. The modulator comprises a comparator 21 having a noninverting input to which the signal from the source 1 is applied and an inverting input to which an output signal from an integrator 24 is applied. These input signals are compared against each other in response to a clock pulse supplied from the clock source 13 and a high level voltage is generated if the source signal is higher than the integrator output and a low level output is generated if the source signal is lower than the integrator output. The output of the comparator 21 is therefore a series of binary 1's and 0's occurring at intervals of 8 microseconds.

The output of the comparator 21 is applied to a shift register 22 which comprises four flip-flop stages with the output of each being connected to the input of the following stage and also to corresponding input terminals of a step-size count logic 23. The count logic 23 may include a built-in counter which counts the clock pulse from source 13 to clear the binary digits received from the shift register 22 at intervals which are an integral multiple of the clock interval. The four-stage shift register 22 is loaded with a varying number of binary digits which is a function of the varying slope of the source signal. Therefore, the shift register will be fully loaded with binary 1's if the input signal varies at a maximum rate and place a binary 1 to all the inputs of the count logic 23. Conversely, if the source signal varies at a minimum rate, the shift register will be fully loaded with binary 0's and place a binary 0 to all the inputs of the count logic. The count logic 23 is arranged to count the number of binary 1's received during the interval set by the built-in counter and generates a corresponding analog signal. The slope representing analog signal is integrated by the integrator 24 so that the integrated signal closely follows the waveform of the source signal. The integrated signal is applied to the comparator 21 for comparison with the source signal. Therefore, when the source signal varies at a higher rate, the comparison is made at a greater step size than it is when the source signal varies at lower rates. The delta modulator can thus adapt itself to the varying slope of the source signal and such modulator can be readily implemented.

Figure 3:
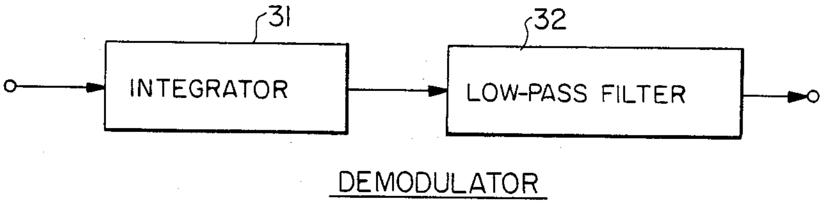
FIG. 3 is a block diagram of a demodulator.

The detail of each of the demodulators 4 is shown in FIG. 3. The demodulator comprises an integrator 31 and a low-pass filter 32 connected thereto. The integrator 31 of each demodulator 4 provides integration of the delayed binary 1's of the associated memory cells to generate an analog signal which is a replica of a differently delayed source signal. The low-pass filter 32 eliminates quantum noise inherently contained in the reconstructed signal.

Returning to FIG. 1, the output signals of the first memory group 3*a* of the tapped delay line 3 are converted to analog signals by demodulators 41 to 43 and summed in the adder 5 to provide a first delayed output and the output signals of the second memory group 3*b* are converted to analog signals by demodulators 44 to 46 and summed in the adder 10 to provide a second delayed output.

The second, recirculating delay section B of the reverberator comprises, for example, first and second sets of recirculating delay lines in pairs. The first set comprises a pair of recirculating delay lines 6 and 7 and the second set comprises a pair of recirculating delay lines 11 and 12. The delay lines 6, 7, 11 and 12 are of identical construction. The delay line 6 comprises an adder 61 having a first input coupled to the output of adder 5, an adaptive delta modulator 62 which is identical to that shown in FIG. 2 and is connected to the output of adder 61, a digital delay memory 63 which can be formed by a portion of the memory 3 to store one-bit digital signals from the modulator 62, and a demodulator 64 which is identical to that shown in FIG. 3 and is connected to the output of memory 63. The output of demodulator 64 is applied to an input of an adder 15 to which the source signal is also applied. A variable resistor 65 forms a feedback path from the output of demodulator 64 to a second input of the adder 61.

The first delayed output from the first delay section A is thus additionally delayed by an amount determined by the delay memory 63 and a portion of this delayed signal is fed back through the variable resistor 65 to the adder 61 to enter the delay path again. The variable resistor 65 is adjusted so that the feedback signal decays at a desired rate.

Since the delay time ratios of the delayed components of the first output of the adder 5 are irrational numbers as described above, the recirculating operation of the delay line 6 causes each of these components to occur at random with respect to the other components with a desired rate of decay. Therefore, the delayed components delivered from the recirculating delay line 6 are clustered at closely spaced intervals.

It is essential therefore that the first section A of the reverberator is required to produce at least one pair of output signals which are delayed by different amounts with respect to the source signal such that the ratio of the delay times is an irrational number and that the second section B is required to comprise at least one recirculating delay line.

The recirculating delay line 7 comprises an adder 71 having a first input coupled to the output of adder 5, an adaptive delta modulator 72, a delay memory 73 which is also formed by a portion of the RAM 3, a demodulator 74 and a variable resistor 75 coupled in a recirculating path from the output of demodulator 74 to a second input of the adder 71. The delay line 7 performs a similar delay function on the output signal from the adder 5. The delay memories 63 and 73 are controlled by the address generator 14 and introduce delay times $t_1$ and $t_2$, respectively. The delay time ratio $t_2/t_1$ is preferably an irrational number.

The second delayed output from the adder 10 is coupled to the recirculating delay lines 11 and 12. The delay line 11 includes an adder 111 having a first input coupled to the output of adder 10, an adaptive delta modulator 112, a delay memory 113 formed by a portion of the RAM 3, a demodulator 114 and a variable resistor 115 in a recirculating line from the output of demodulator 114 to a second input of adder 111. Likewise, the delay line 121 comprises an adder 121 having a first input coupled to the output of adder 10, and an adaptive delta modulator 122, a delay memory 123 formed by a portion of the RAM 3, a demodulator 124 and a variable resistor 125 connected in a recirculating line from the output of demodulator 124 to a second input of adder 121. The delay memories 113 and 123 are addressed by the address generator 14 to introduce delay times $t_3$ and $t_4$ with the ratio $t_4/t_3$ being an irrational number. Preferably, the ratio $t_3/t_2$ is also an irrational number. In a further preferred embodiment, the ratio $t_1:t_2:t_3:t_4$ is $1:0.9(\pm 0.02):0.8(\pm 0.02):0.7(\pm 0.02)$. Suitable values of these delay times are $t_1 = 83.5$ ms, $t_2 = 74.5$ ms, $t_3 = 63.3$ ms and $t_4 = 58.9$ ms.

The output signals of the recirculating delay lines 6, 7, 11 and 12 are summed in the adder 15 to which the source signal is also applied to generate an audio output. The variable resistors 65, 75, 115 and 125 are adjusted in relation to each other to allow the reverberation sound to decay over an optimum time. Since the reverberation sound components are closely spaced apart, the impulse response of the reverberator of the invention has no noticeable peaks and dips over the audio frequency spectrum. Reverberation is no longer accompanied with undesirable echos that occur at regular intervals, but follows a smoothly decaying logarithmic curve that closely approximates the realism.

The present invention can be modified in a number of ways. An embodiment shown in FIG. 4 further includes a pre-delay section C formed by an adaptive delta modulator 51 coupled to the signal source 1, a random access memory 52 whose write/read operations are controlled by the address generator 14, and a demodulator 53. The output of the demodulator 53 is fed to the tapped delay section A. The adders 5 and 10 are further responsive to a direct signal from the pre-delay section C supplied through lines 54 and 55. The delay time introduced by the RAM 52 must satisfy the irrational relationship with the delay times assigned to the memory cells of the RAM 3. Suitable delay times are $t_{00}=60$ ms, $t_{11}=83.2$ ms, $t_{22}=42.8$ ms, $t_{33}=18.4$ ms, $t_{44}=70.1$ ms, $t_{55}=29.8$ ms, $t_{66}=9.9$ ms, $t_1=73.0$ ms, $t_2=60$ ms, $t_3=52.5$ ms and $t_4=45.2$ ms. This embodiment allows efficient use of circuit components such as adaptive delta modulators and demodulators to increase the number of output signals available from the tapped delay section A.

Figure 4:
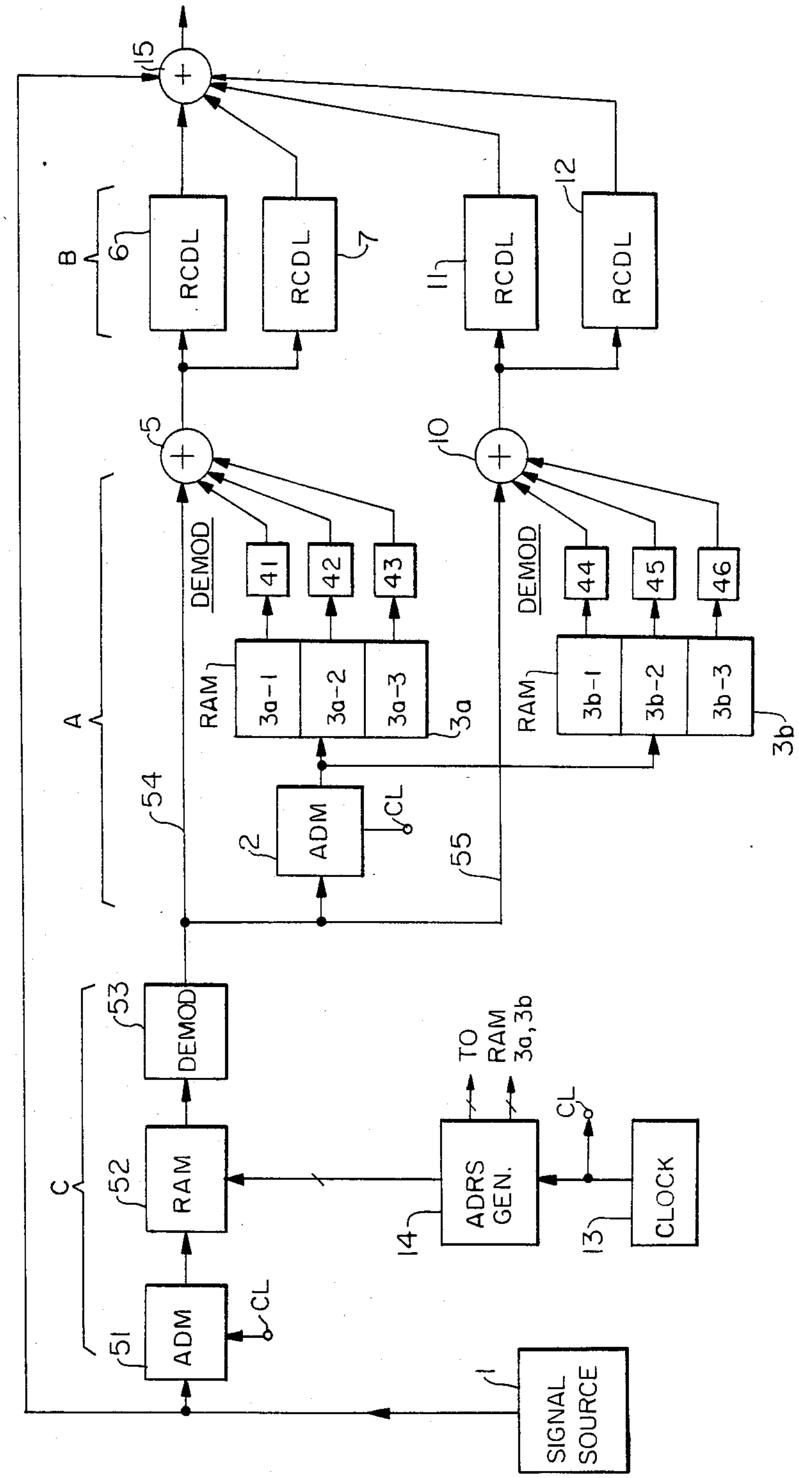
FIGS. 4 and 5 are illustrations of other preferred embodiments of the present invention.
Figure 5:
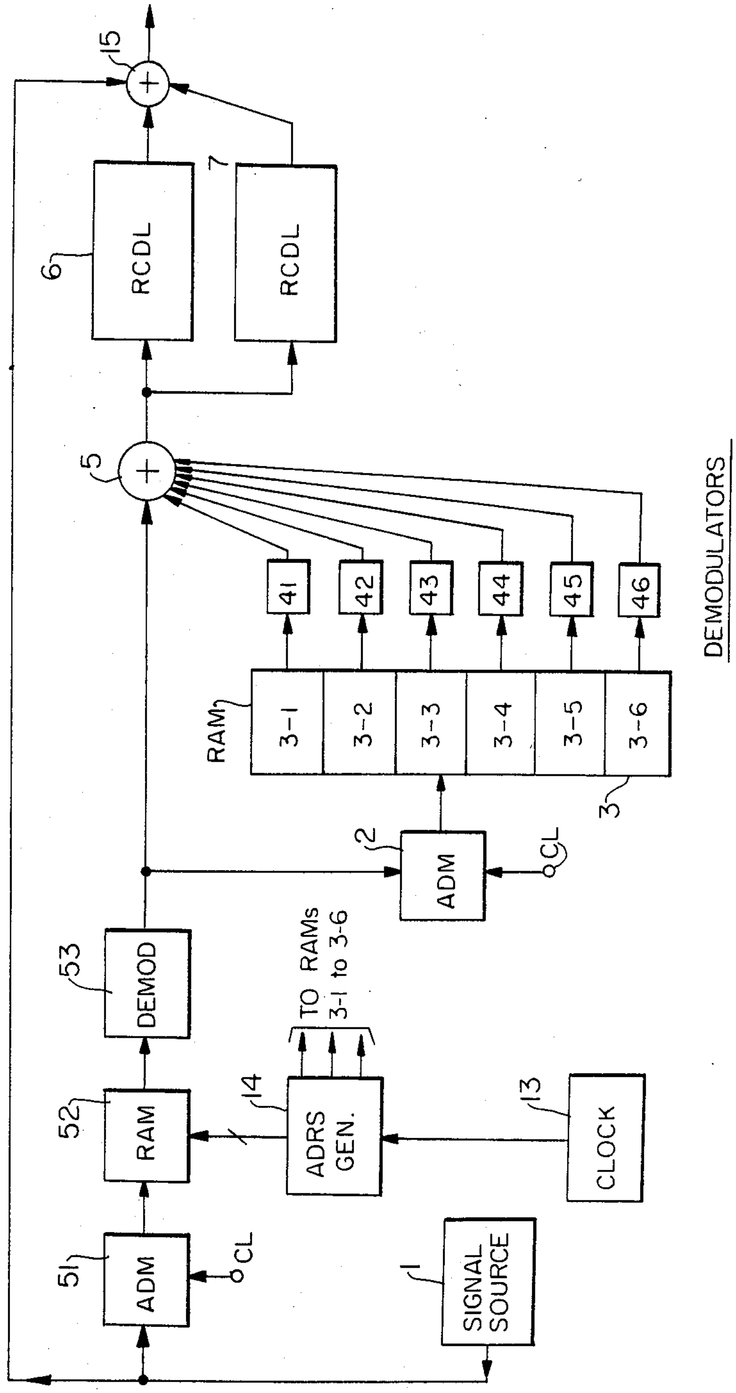

FIG. 5 is an illustration of a further modification of the invention which is similar to the embodiment of FIG. 4 with the exception that the outputs of demodulators 41 to 46 are all combined in the adder 5 eliminating the adder 10 and delay line 12, while including the delay line 7.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A reverberator comprising:

analog to digital converting means for converting an analog audio source signal into a digital signal;

memory means;

address means for inputting the digital signal into said memory means and reading it therefrom at clock intervals and generating first and second digital signals which are delayed by first and second different values of delay time with respect to the source signal, the ratio of said first value to said second value being a fractional number;

first and second digital to analog converting means for converting the first and second digital signals into first and second analog signals, respectively;

a first recirculating delay line having first delay means for introducing an additional delay time to said first analog signal and a first resistive recirculating path for recirculating the output signal of said first delay means therethrough;

a second recirculating delay line having second delay means for introducing an additional delay time to said second analog signal and a second resistive recirculating path for recirculating the output signal of said second delay means therethrough; and means for combining said source signal with output signals from said first and second recirculating delay lines.

2. A reverberator as claimed in claim 1, wherein each of said first and second resistive recirculating paths is provided with a variable resistor.

3. A reverberator as claimed in claim 1, wherein said analog to digital converting means comprises a delta modulator.

4. A reverberator as claimed in claim 3, wherein said delta modulator comprises an adaptive delta modulator.

5. A reverberator as claimed in claim 4, wherein said adaptive delta modulator comprises:

a comparator for comparing said source signal with a feedback signal and generating a binary "1" or a binary "0" depending on the comparison;

a shift register having a plurality of successive bit positions for loading said binary "1"s and "0"s into the bit positions;

means coupled to the bit positions of said shift register for generating an analog signal corresponding to the bit positions loaded with said binary "1"s; and an integrator for integrating said analog signal and applying the integrated signal to said comparator as said feedback signal.

6. A reverberator as claimed in claim 1, wherein each of said first and second digital to analog converting means comprises an integrator.

7. A reverberator as claimed in claim 1, wherein said first delay means comprises:

analog to digital converting means for converting said first analog signal into a first digital signal;

a memory for storing the first digital signal therein and reading the stored first digital signal in response to said address means; and digital to analog converting means for converting the digital signal read out of said memory into an analog signal, wherein said first resistive recirculating path is connected between the output of the last-mentioned digital to analog converting means and the input of the last-mentioned analog to digital converting means, wherein said second delay means comprises:

analog to digital converting means for converting said second analog signal into a second digital signal;

a memory for storing the second digital signal therein and reading the stored second digital signal in response to said address means; and digital to analog converting means for converting the digital signal read out of the last-mentioned memory into an analog signal, wherein said second resistive recirculating path is connected between the output of the last-mentioned digital to analog converting means and the input of last-mentioned analog to digital converting means.

8. A reverberator as claimed in claim 7, wherein the analog to digital converting means of each of said first and second delay means comprises a delta modulator.

9. A reverberator as claimed in claim 8, wherein said delta modulator comprises an adaptive delta modulator.

10. A reverberator as claimed in claim 9, wherein said adaptive delta modulator comprises:

a comparator for comparing said source signal with a feedback signal and generating a binary "1" or a binary "0" depending on the comparison;

a shift register having a plurality of successive bit positions for loading said binary "1"s and "0"s into the bit positions;

means coupled to the bit positions of said shift register for generating an analog signal corresponding to the bit positions loaded with said binary "1"s; and an integrator for integrating said analog signal and applying the integrated signal to said comparator as said feedback signal.

11. A reverberator comprising:

an adaptive delta modulator connected to an analog signal source for converting the source signal into a digital signal;

a plurality of memories comprising first and second groups;

memory control means, addressing said memories at clock intervals, for inputting said digital signal into and reading it from said memories and generating a plurality of digital signals which are delayed by successively different values of delay time with respect to the source signal, the ratio of the successive delay time values being a fractional number;

a first plurality of demodulators respectively associated with said memories of a first group for converting the digital signals read out of the first group memories;

a second plurality of demodulators respectively associated with said memories of a second group for converting the digital signals read out of the second group memories;

first combining means for combining output signals of said first plurality of demodulators;

second combining means for combining output signals of said second plurality of demodulators;

a first plurality of recirculating delay lines responsive to an output signal from said first combining means for generating a plurality of mutually delayed output signals;

a second plurality of recirculating delay lines responsive to an output signal from said second combining means for generating a plurality of mutually delayed output signals; and third combining means for combining the output signals of said first and second pluralities of said recirculating delay lines with the source signal.

12. A reverberator comprising:

a first adaptive delta modulator connected to an analog signal source for converting the source signal into a digital signal;

a first memory;

memory control means, addressing said first memory at clock intervals, for writing the digital signal from said first adaptive delta modulator into and reading it from the first memory as an output signal;

a first demodulator responsive to the output signal from said first memory for converting the same into an analog output signal;

a second adaptive delta modulator responsive to the analog output signal from said first demodulator;

a plurality of second memories comprising first and second groups addressed by the memory control means at clock intervals, the memory control means writing the output signal from said first demodulator into and reading it from said second memories and generating a plurality of digital signals which are delayed by successively different values of delay time with respect to the source signal, the ratio of the successive delay time values being a fractional number;

a first plurality of second demodulators respectively associated with said second memories of a first group for converting the digital signals read out of the first group memories;

a second plurality of second demodulators respectively associated with said second memories of a second group for converting the digital signals read out of the second group memories;

first combining means for combining output signals of said first plurality of second demodulators;

second combining means for combining output signals of said second plurality of second demodulators;

a first plurality of recirculating delay lines responsive to an output signal from said first combining means for generating a plurality of mutually delayed output signals;

a second plurality of recirculating delay lines responsive to an output signal from said second combining means for generating a plurality of mutually delayed output signals; and third combining means for combining the output signals of said first and second pluralities of said recirculating delay lines with the source signal.

13. A reverberator comprising:

a first adaptive delta modulator connected to an analog signal source for converting the source signal into a digital signal;

a first memory;

memory control means, addressing said first memory at clock intervals, for writing the output signal from said first adaptive delta modulator into and reading it from the first memory as an output signal;

a first demodulator responsive to the output signal from said first memory for converting the same into an analog output signal;

a second adaptive delta modulator responsive to the analog output signal from said first demodulator;

a plurality of second memories addressed by the memory control means at clock intervals, the memory control means writing the output signal from said first demodulator into and reading it from said second memories and generating a plurality of digital signals which are delayed by successively different values of delay time with respect to the source signal, the ratio of the successive delay time values being a fractional number containing a series of fractions;

a plurality of second demodulators respectively associated with said second memories for converting the digital signals read out of the second memories;

first combining means for combining output signals of said first and second demodulators;

a plurality of recirculating delay lines responsive to an output signal from said combining means for generating a plurality of mutually delayed output signals; and second combining means for combining the output signals of said plurality of said recirculating delay lines with the source signal.

* * * * *